United States Patent
Yoo et al.

(10) Patent No.: US 10,326,111 B2
(45) Date of Patent: Jun. 18, 2019

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventors: Byeongwook Yoo, Yongin-si (KR); Hyoyeon Kim, Yongin-si (KR); Yoonmo Song, Yongin-si (KR); Hajin Song, Yongin-si (KR); Jihwan Yoon, Yongin-si (KR); Sangwoo Pyo, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 442 days.

(21) Appl. No.: 14/884,183

(22) Filed: Oct. 15, 2015

(65) Prior Publication Data
US 2016/0308162 A1     Oct. 20, 2016

(30) Foreign Application Priority Data

Apr. 16, 2015 (KR) .......................... 10-2015-0053771

(51) Int. Cl.
*H01L 51/54* (2006.01)
*H01L 51/52* (2006.01)
*H01L 27/32* (2006.01)

(52) U.S. Cl.
CPC ...... *H01L 51/5275* (2013.01); *H01L 27/3244* (2013.01); *H01L 2227/323* (2013.01)

(58) Field of Classification Search
CPC ..... H01L 27/30; H01L 27/32; H01L 27/3241; H01L 27/3244; H01L 2227/00; H01L 2227/32; H01L 2227/323; H01L 51/0032; H01L 51/005; H01L 51/0052; H01L 51/0059; H01L 51/006; H01L 51/0061; H01L 51/0071; H01L 51/0072; H01L 51/0079; H01L 51/0081; H01L 51/50; H01L 51/52; H01L 51/5237; H01L 51/524; H01L 51/5253; H01L 51/5256; H01L 51/5262; H01L 51/5271; H01L 51/5275; H01L 51/56
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

| | | | |
|---|---|---|---|
| 9,093,663 B2 | 7/2015 | Yoon et al. | |
| 2003/0234609 A1* | 12/2003 | Aziz | H01L 51/5281 313/504 |
| 2009/0212696 A1* | 8/2009 | Terao | H01L 51/5265 313/506 |
| 2010/0320446 A1* | 12/2010 | Kang | H01L 51/5265 257/40 |
| 2011/0121271 A1 | 5/2011 | Jeon et al. | |
| 2012/0138918 A1 | 6/2012 | Naraoka et al. | |
| 2012/0313099 A1* | 12/2012 | Chung | H01L 27/3276 257/59 |

FOREIGN PATENT DOCUMENTS

| | | |
|---|---|---|
| KR | 10-2011-0058126 | 6/2011 |
| KR | 10-2012-0080536 | 7/2012 |
| KR | 10-2013-0066743 | 6/2013 |
| KR | 10-2015-0049260 | 5/2015 |

* cited by examiner

*Primary Examiner* — Andrew K Bohaty
(74) *Attorney, Agent, or Firm* — H.C. Park & Associates, PLC

(57) ABSTRACT

Provided are an organic light-emitting diode display apparatus and a method of manufacturing the same. In an exemplary embodiment, an organic light-emitting diode (OLED) display apparatus includes a substrate, an OLED device on the substrate, and a capping layer on the organic light-emitting device. The capping layer includes a first capping layer and a second capping layer. The second capping layer includes a first material and a second material. The first material and the second material are different from each other.

19 Claims, 2 Drawing Sheets

ORGANIC LIGHT-EMITTING DISPLAY APPARATUS AND METHOD OF MANUFACTURING THE SAME

CROSS-REFERENCE TO RELATED APPLICATION

This application claims priority from and the benefit of Korean Patent Application No. 10-2015-0053771, filed on Apr. 16, 2015, which is hereby incorporated by reference for all purposes as if fully set forth herein.

BACKGROUND

Field

Exemplary embodiments relate to an organic light-emitting diode (OLED) display apparatus and a method of manufacturing the same.

Discussion of the Background

An OLED device may include a first electrode disposed on a substrate and a hole transport region, an emission layer, an electron transport region, and a second electrode that are sequentially disposed on the first electrode. Holes generated by the first electrode may move toward the emission layer through the hole transport region, and electrons generated the second electrode may move toward the emission layer through the electron transport region. Excitons are generated by recombination of carriers, such as holes and electrons, in the emission layer. As the excitons change from an excited state to a ground state, light is generated.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments include an organic light-emitting display apparatus and a method of manufacturing the same.

Additional aspects will be set forth in the detailed description which follows, and, in part, will be apparent from the disclosure, or may be learned by practice of the inventive concept.

An exemplary embodiment discloses an organic light-emitting diode (OLED) display apparatus includes a substrate, an OLED device on the substrate, and a capping layer on the organic light-emitting device. The capping layer includes a first capping layer and a second capping layer. The second capping layer includes a first material and a second material. The first material and the second material are different from each other.

An exemplary embodiment also discloses a method of manufacturing an organic light-emitting diode (OLED) display apparatus. The method includes forming an OLED device on a substrate and forming a capping layer on the OLED device. The capping layer includes a first capping layer and a second capping layer. The second capping layer includes a first material and a second material that are different from each other.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION

Figure 1:
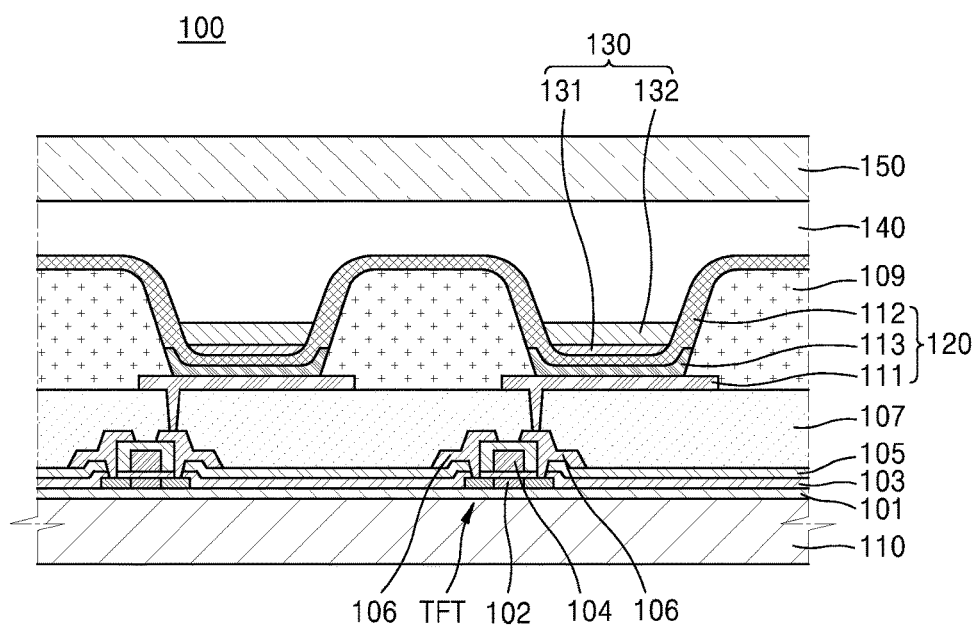
FIG. 1 is a cross-sectional view illustrating an organic light-emitting display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

An exemplary embodiment is described herein with reference to a sectional illustration that is a schematic illustration of an idealized exemplary embodiment. As such, variations from the shapes of the illustration as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic cross-sectional view illustrating an organic light-emitting display apparatus according to an exemplary embodiment.

An organic light-emitting diode (OLED) display may include a substrate 110, an organic light-emitting diode (OLED) device 120 on the substrate 110, a capping layer 130 on the OLED device 120, and a sealing substrate 150 on the capping layer 130.

The substrate 110 may be any substrate that is used in typical OLED display apparatuses. The substrate 110 may include an inorganic substrate and/or an organic substrate with high mechanical strength, thermal stability, transparency, surface smoothness, ease of handling, and water resistance. In an exemplary embodiment, the substrate 110 includes an inorganic substrate such as a transparent glass material including $SiO_2$. In an exemplary embodiment, the substrate 110 includes an insulating organic material. The insulating organic material may include at least one of polyethersulphone (PES), polyacrylate (PAR), polyetherimide (PEI), polyethylene napthalate (PEN), polyethyleneterepthalate (PET), polyphenylene sulfide (PPS), polyallylate, polyimide, polycarbonate (PC), cellulose tri acetate (TAC), and cellulose acetate propionate (CAP). Although certain materials for the substrate 110 are described above, exemplary embodiments are not limited to these materials. Exemplary embodiments include a substrate 110 including any suitable material.

When the OLED display apparatus is a bottom emission type (i.e., an OLED device that displays an image in a direction toward the substrate 110), the substrate 110 may include a transparent material. When the OLED display apparatus is a top emission type (i.e., an OLED device that displays an image in a direction away from the substrate 110), the substrate 110 may not include a transparent material. When the OLED display apparatus is a top emission type, the substrate 110 may include a metal. For example, the substrate 110 may include at least one of carbon, iron, chromium, manganese, nickel, titanium, molybdenum, stainless steel (SUS), an Invar alloy, an Inconel alloy, and a Kovar alloy. Exemplary embodiments are not limited to the listed materials. The substrate may include any suitable metal. The substrate 110 may also be formed of a metallic foil.

A buffer layer 101 may be formed on the substrate 110 to prevent impurities from penetrating the substrate 110 and to provide a plane surface on the top of the substrate 110. The buffer layer 101 may include $SiO_2$ and/or $SiN_X$. The buffer layer 101 may be deposited by various methods, such as plasma enhanced chemical vapor deposition (PECVD), atmospheric pressure chemical vapor deposition (APCVD), and/or low pressure chemical vapor deposition (LPCVD). In an exemplary embodiment, the buffer layer 101 is omitted.

An array of thin film transistor TFT may be formed on the substrate 110. For ease of reference, FIG. 1 illustrates that a thin film transistor TFT may be formed for each pixel. However, exemplary embodiments are not limited thereto, and a pixel may further include multiple thin film transistors TFT and a storage capacitor.

The thin film transistors TFT may be electrically connected to an organic light-emitting diode (OLED) device to drive the OLED device. As shown in FIG. 1, the thin film transistor TFT may be a top gate type. An active layer 102, a gate electrode 104, and source and drain electrodes 106 may be sequentially stacked as the thin film transistor TFT. Although the thin film transistor is illustrated and described as a top gate type, exemplary embodiments include various types of thin film transistors TFT.

The active layer 102 may include forming an inorganic semiconductor layer, such as a silicon (Si) layer, and/or an oxide semiconductor layer. The active layer 102 may include forming an organic semiconductor layer. The active layer 102 may be formed an entire surface of the substrate 110 on the buffer layer 101 and then patterning the same. When the active layer 102 is formed of silicon, an amorphous silicon layer may be formed on the entire surface of the substrate 110 and then crystallized, thereby forming a polycrystalline layer. After the polycrystalline layer is patterned, a source area and a drain area may be doped with impurities, and thus, the active layer 102 that includes the source area, the drain area, and a channel area disposed therebetween may be formed.

A gate insulating layer 103 including $SiO_2$ and/or $SiN_X$ may be formed on the active layer 102, and a gate electrode 104 may be formed on a portion of an upper surface of the gate insulating layer 103. The gate electrode 104 may be connected to a gate line (not shown) transmitting on/off signals of the thin film transistor TFT.

An interlayer insulating layer 105 may be formed on the gate electrode 104. The source and the drain electrodes 106 may respectively contact a source area and a drain area of the active layer 102 though contact holes in the interlayer insulating layer 105 and the gate insulating layer 103. The thin film transistor TFT may be covered by a passivation layer 107 for protection.

The passivation layer 107 may include an inorganic insulating layer and/or an organic insulating layer. The inorganic insulating layer of the passivation layer 107 may include at least one of silicon dioxide ($SiO_2$), silicon nitride ($SiN_x$), silicon oxynitride (SiON), aluminum oxide ($Al_2O_3$), titanium dioxide ($TiO_2$), tantalum pentoxide ($Ta_2O_5$), hafnium(IV) oxide ($HfO_2$), zirconium dioxide ($ZrO_2$), Barium-strontium titanate ((($Ba_xSr_y$)$TiO_3$) or (BST)), and lead zirconate titanate (PZT). The organic insulating layer of the passivation layer 107 may include at least one of poly (methyl methacrylate) (PMMA), polystyrene (PS), polymer derivatives having a phenol-based group, an acryl-based polymer, an imide-based polymer, an aryl ether-based polymer, an amide-based polymer, a fluorine-based polymer, a p-xylene-based polymer, and a vinyl alcohol-based polymer. In an exemplary embodiment, the passivation layer 107 is a stack layer in which the inorganic insulating layer and the organic insulating layer are stacked.

The passivation layer 107 may include an emission area and a non-emission area. An organic light-emitting diode (OLED) device may be formed on the emission area of the passivation layer 107. The emission area and the non-emission area will be described in detail along with the descriptions for a pixel defining layer 109.

The organic light-emitting diode (OLED) device 120 may include a first electrode 111 formed on the passivation layer 107, a second electrode 112 facing the first electrode 111, and an intermediate layer 113 disposed between the first electrode 111 and the second electrode 112. The OLED display apparatus may be a bottom emission type, a top emission type, a dual emission type, or the like, depending on a light-emission direction. When the OLED display apparatus is the bottom emission type, the first electrode 111 may be a transparent electrode and the second electrode 112 may be a reflective electrode. When the organic light-emitting display apparatus is the top emission type, the first electrode 111 may be a reflective electrode and the second electrode 112 may be a transparent electrode. Throughout this application the OLED display apparatus is described as a bottom emission type for ease of reference but not by way of limitation. Thus, the OLED display apparatus may include any suitable OLED display apparatus.

When the first electrode 111 is an anode, the material for the first electrode may be selected from materials with a high work function to make holes be easily injected. The first electrode 111 may be a reflective electrode or a transmissive electrode. The first electrode 111 may include at least one of indium tin oxide (ITO), indium zinc oxide (IZO), tin oxide ($SnO_2$), zinc oxide (ZnO), silver (Ag), magnesium (Mg), aluminum (Al), aluminum-lithium (Al—Li), calcium (Ca), magnesium-indium (Mg—In), and magnesium-silver (Mg—Ag).

The first electrode 111 may have a single-layer structure or a multi-layer structure including a multiple layers. For example, the first electrode 111 may have a triple-layer structure of ITO/Ag/ITO, but embodiments are not limited to such a structure.

The first electrode 111 may be patterned in an island shape corresponding to each pixel. In addition, the first electrode 111 may be connected to an external terminal (not shown) to serve as an anode.

The pixel-defining layer (PDL) 109 may include an insulating material and may cover the first electrode 111. The PDL 109 may be formed on the first electrode 111 to a predetermined thickness. The PDL 109 may include at least one organic insulating material. The organic material for the PDL 109 may include at least one of a polyimide, a polyamide, an acryl resin, benzocyclobutene (BCB), and a phenol resin. The organic material for the PDL may be formed by spin coating or the like. An emission area may be formed by forming a predetermined opening in the PDL 109 that exposes a central portion of the first electrode 111 and vapor-depositing an organic emission layer. The organic emission layer may emit light from a predetermined area in the opening. In an alternate exemplary embodiment, a portion protruding from the emission area is naturally formed between the emission areas when an emission area is formed by forming the opening in the PDL 109. As an organic emission layer is not formed thereon, the portion is referred to as a non-emission area.

The second electrode 112 may be a cathode that is an electron injection electrode. The second electrode 112 may include a material having a low work function such as a metal, an alloy, an electrically conductive compound, or a mixture thereof. The second electrode 112 may be a transmissive electrode. The transmissive electrode may include forming a thin film of lithium (Li), magnesium (Mg), aluminum (Al), aluminum-lithium (Al—Li), calcium (Ca), magnesium-indium (Mg—In), and/or magnesium-silver (Mg—Ag). In an exemplary embodiment, ITO or IZO is used to form a transmissive second electrode to manufacture a top emission light-emitting device.

The second electrode 112 may be formed on the whole surface of the substrate 110 as a common electrode. In addition, the second electrode 112 may be connected to an external terminal (not shown) to serve as a cathode.

The first electrode 111 and the second electrode 112 may have opposite polarities.

A thickness of the second electrode 112 may be in a range of about 1 nm to about 150 nm. In an exemplary embodiment, a thickness of the second electrode 112 is in a range of about 1 nm to about 100 nm, but the embodiments are not limited to such thicknesses.

A capping layer 130 may be formed on the OLED device 120. The capping layer 130 may cause constructive interference of light emitted from the organic light-emitting diode (OLED) device 120, thereby increasing the efficiency of light extraction. The capping layer 130 may include a first capping layer 131 and a second capping layer 132.

The second capping layer 132 may include a first material and a second material. The first material and the second material of the second capping layer 132 may be different from each other.

The first material may be an organic low molecular weight compound. In an exemplary embodiment, the first material is represented by Chemical Formula 201:

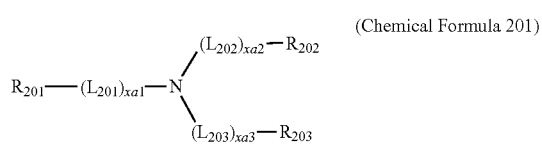

(Chemical Formula 201)

wherein, $L_{201}$, $L_{202}$, and $L_{203}$ may be each independently selected from a substituted or unsubstituted $C_3$-$C_{10}$ cycloalkylene, a substituted or unsubstituted $C_1$-$C_{10}$ heterocycloalkylene, a substituted or unsubstituted $C_3$-$C_{10}$ cycloalkenylene, a substituted or unsubstituted $C_1$-$C_{10}$ heterocycloalkenylene, a substituted or unsubstituted $C_6$-$C_{60}$ arylene, a substituted or unsubstituted $C_1$-$C_{60}$ heteroarylene, a substituted or unsubstituted divalent non-aromatic condensed polycyclic group, and a substituted or unsubstituted divalent non-aromatic condensed heteropolycyclic group;

xa1, xa2, and xa3 may be each independently selected from 0, 1, 2, and 3;

$R_{201}$, $R_{202}$, and $R_{203}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_1$-$C_{60}$ heteroaryl group, substituted monovalent non-aromatic condensed polycyclic group, and substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In an exemplary embodiment, $L_{201}$, $L_{202}$, and $L_{203}$ of Chemical Formula 201 are each independently selected from a phenylene group, a naphthylenylene group, a fluorenylene group, a spiro-fluorenylene group, a benzofluorene group, a dibenzofluorene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group, but embodiments are not limited thereto.

In an exemplary embodiment, xa1, xa2, and xa3 of Chemical Formula 201 are each independently 0, 1, or 2, but embodiments are not limited thereto.

In an exemplary embodiment, $R_{201}$ $R_{202}$, and $R_{203}$ of Chemical Formula 201 are each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but embodiments are not limited thereto.

In an exemplary embodiment, the first material of the second capping layer 132 are represented by Chemical Formula 201A, but embodiments are not limited thereto:

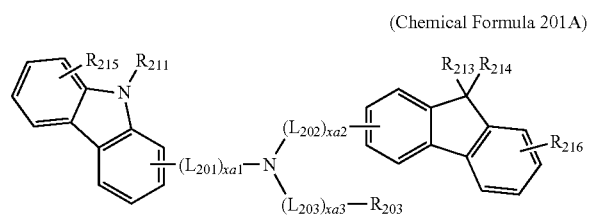

(Chemical Formula 201A)

wherein, $L_{201}$, $L_{202}$, and $L_{203}$ may be each independently selected from a substituted or unsubstituted $C_3$-$C_{10}$ cycloalkylene, a substituted or unsubstituted $C_1$-$C_{10}$ heterocycloalkylene, a substituted or unsubstituted $C_3$-$C_{10}$ cycloalkenylene, a substituted or unsubstituted $C_1$-$C_{10}$ hetetocycloalkenylene, a substituted or unsubstituted $C_6$-$C_{60}$ arylene, a substituted or unsubstituted $C_1$-$C_{60}$ heteroarylene, a substituted or unsubstituted divalent non-aromatic condensed polycyclic group, and a substituted or unsubstituted divalent non-aromatic condensed heteropolycyclic group;

xa1, xa2, and xa3 may be each independently selected from 0, 1, 2, and 3;

$R_{203}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$R_{211}$, $R_{212}$, $R_{213}$, $R_{214}$, $R_{215}$, and $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_1$-$C_{60}$ heteroaryl group, substituted monovalent non-aromatic condensed polycyclic group, and substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In an exemplary embodiment, $L_{201}$, $L_{202}$, and $L_{203}$ of Chemical Formula 201A are each independently selected from a phenylene group, a naphthylene group, a fluorenylene group, a spiro-fluorenylene group, a benzofluorene group, a dibenzofluorene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group;

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1, xa2, and xa3 may be each independently selected from 0, 1, and 2;

$R_{203}$ may be selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and $R_{211}$, $R_{212}$, $R_{213}$, $R_{214}$, $R_{215}$, and $R_{216}$ may be each independently selected from a hydrogen, a deuterium, a $C_1$-$C_{20}$ alkyl group, and a $C_1$-$C_{20}$ alkoxy group, but embodiments are not limited thereto.

In an exemplary embodiment, the first material of the second capping layer 132 are selected from Compounds HT1, HT2, HT3, HT4, HT5, HT6, HT7, HT8, HT9, HT10, HT11, and HT12, but embodiments are not limited thereto:

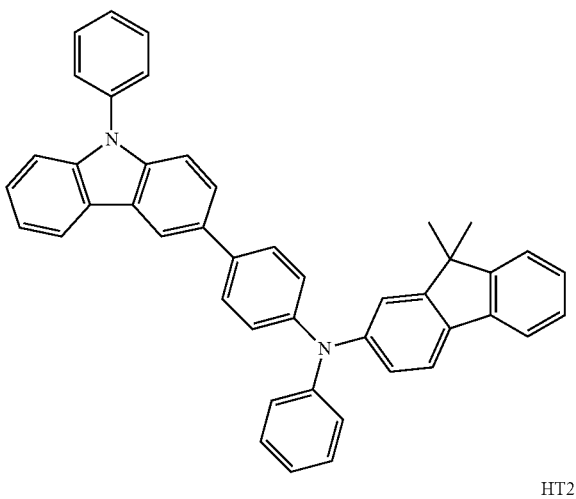

HT1

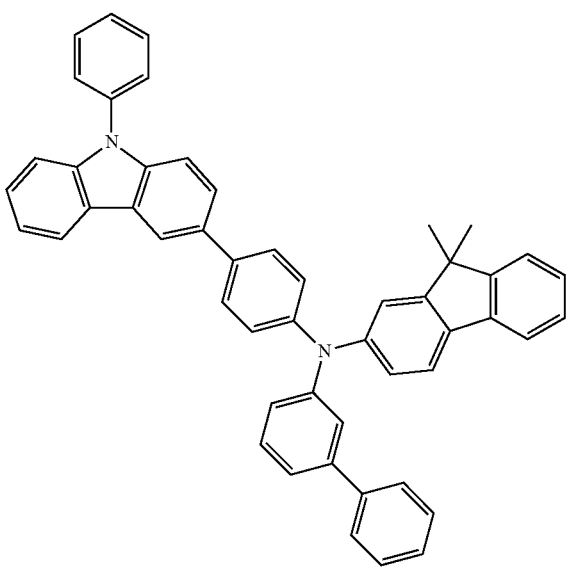

HT2

-continued
HT3
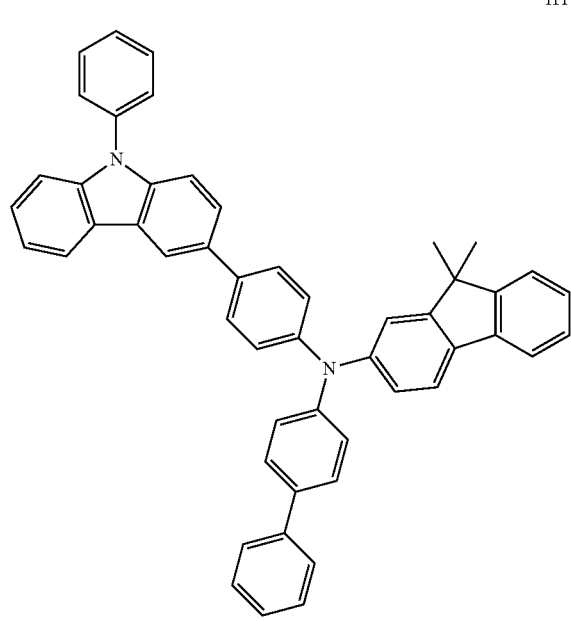
HT5
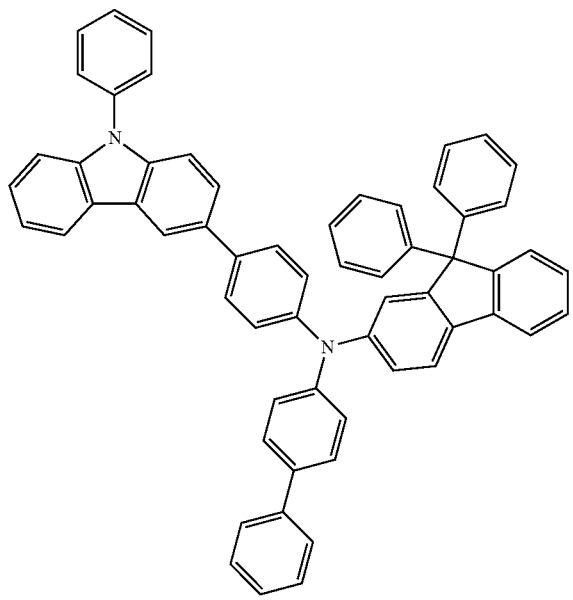
HT4
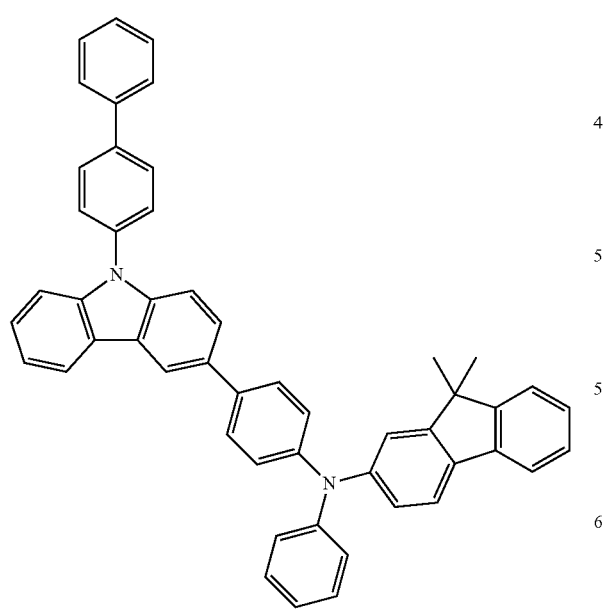
HT6
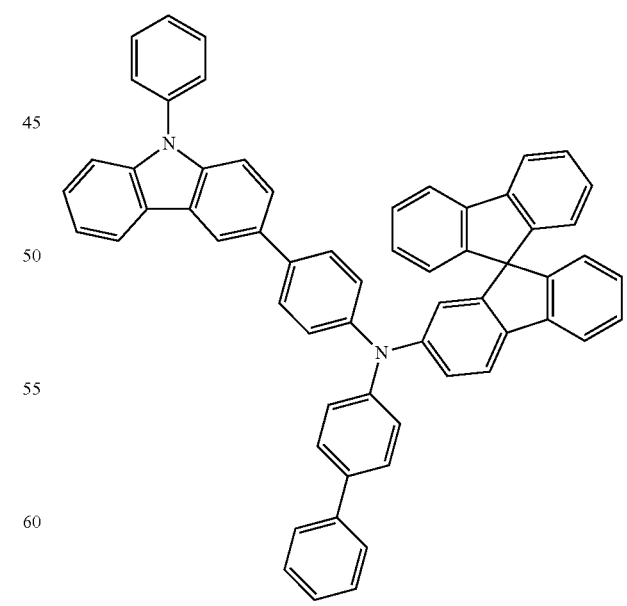

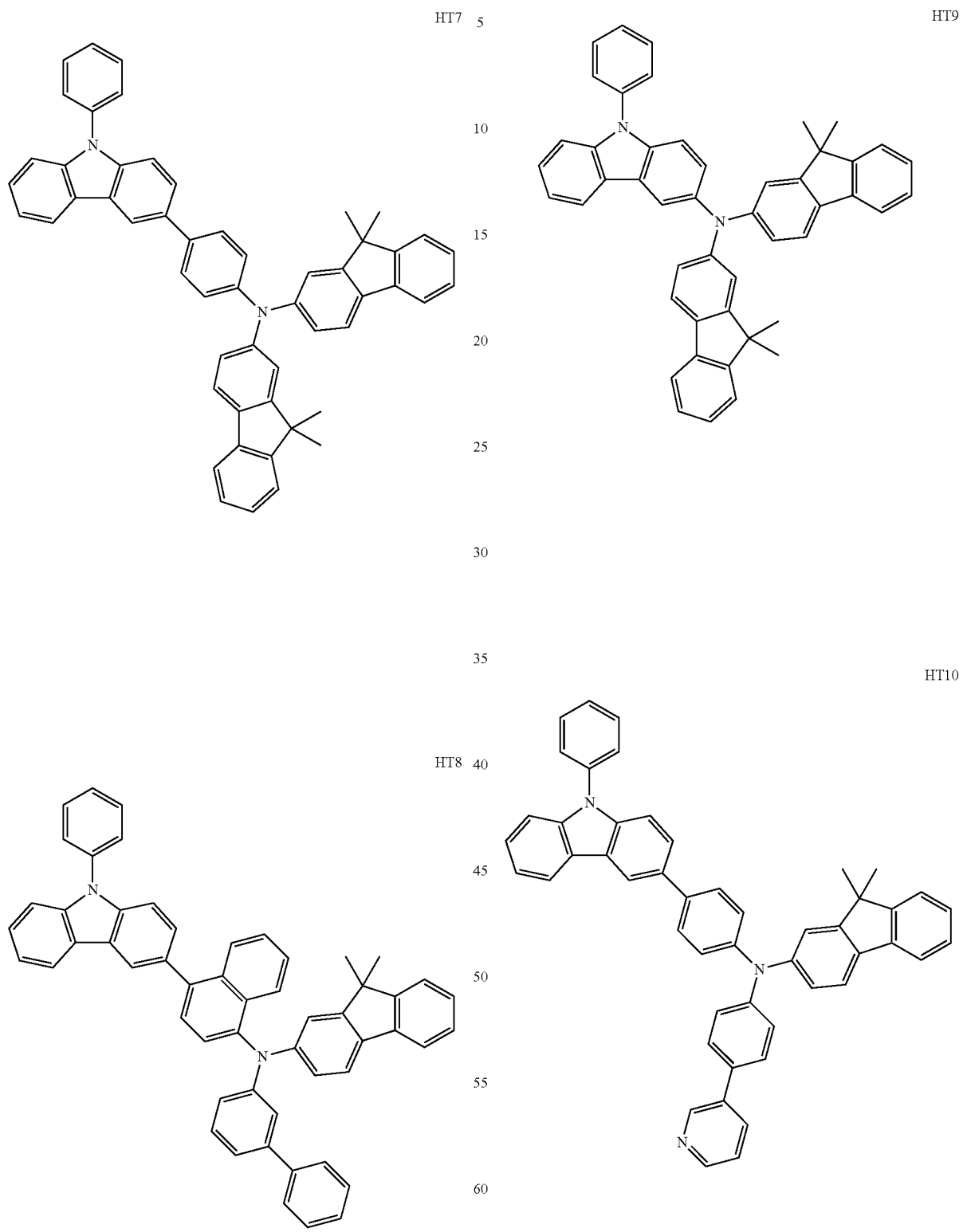

HT11

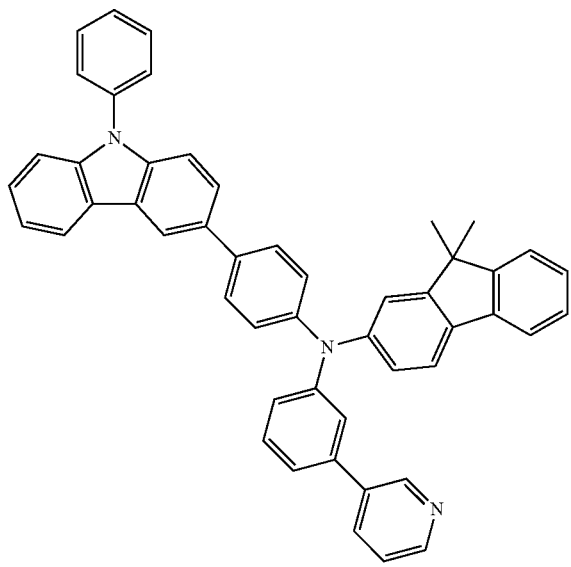

HT12

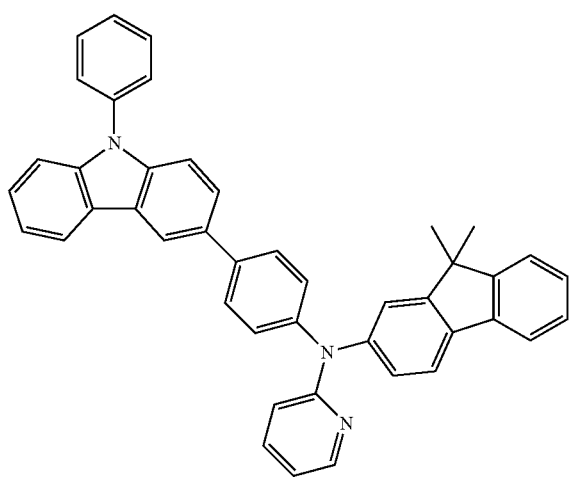

The first material may be an organic polymer compound.

In an exemplary embodiment, the first material is selected from an acrylic resin, a polyimide, and a polyamide. However, exemplary embodiment may include any other suitable material for the first material.

A refractive index of the first material may be in a range of about 1.7 to about 2.7.

The second material may be an organic low molecular weight compound.

In an exemplary embodiment, the second material of the second capping layer 132 is selected from Chemical Formulas 1-1, 1-2, 1-3, 1-4, and 1-5:

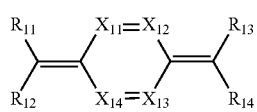

1-1

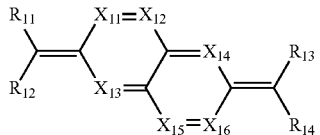

1-2

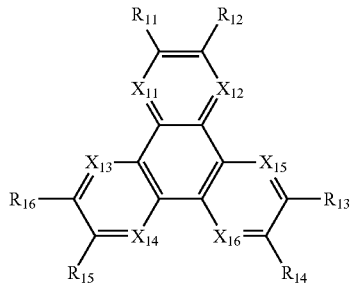

1-3

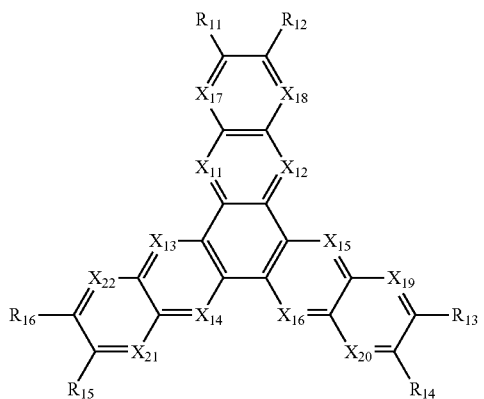

1-4

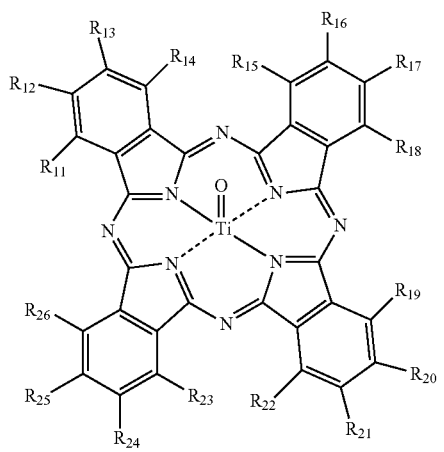

1-5 wherein, in Chemical Formulas 1-1, 1-2, 1-3, 1-4, and 1-5, $R_{11}$, $R_{12}$, $R_{13}$, $R_{14}$, $R_{15}$, $R_{16}$, $R_{17}$, $R_{18}$, $R_{19}$, $R_{20}$, $R_{21}$, $R_{22}$, $R_{23}$, $R_{24}$, $R_{25}$, and $R_{26}$ may be each independently selected from a hydrogen, a deuterium, —F, —Cl, —Br, —I, a cyano group, and a nitro group;

$X_{11}$ may be N or $C(Q_{11})$; $X_{12}$ may be N or $C(Q_{12})$; $X_{13}$ may be N or $C(Q_{13})$; $X_{14}$ may be N or $C(Q_{14})$; $X_{15}$ may be N or $C(Q_{15})$; $X_{16}$ may be N or $C(Q_{16})$; $X_{17}$ may be N or $C(Q_{17})$; $X_{18}$ may be N or $C(Q_{18})$; $X_{19}$ may be N or $C(Q_{19})$, $X_{20}$ may be N or $C(Q_{20})$; $X_{21}$ may be N or $C(Q_{21})$; and $X_{22}$ may be N or $C(Q_{22})$; and $Q_{11}$, $Q_{12}$, $Q_{13}$, $Q_{14}$, $Q_{15}$, $Q_{16}$, $Q_{17}$, $Q_{18}$, $Q_{19}$, $Q_{20}$, $Q_{21}$, and $Q_{22}$ may be each independently selected from hydrogen, deuterium, —F, —Cl, —Br, —I, a cyano group, and a nitro group.

In an exemplary embodiment, $R_{11}$, $R_{12}$, $R_{13}$, $R_{14}$, $R_{15}$, $R_{16}$, $R_{17}$, $R_{18}$, $R_{19}$, $R_{20}$, $R_{21}$, $R_{22}$, $R_{23}$, $R_{24}$, $R_{25}$, and $R_{26}$ of Chemical Formulas 1-1, 1-2, 1-3, 1-4, and 1-5 are each independently selected from hydrogen, —F, —Cl, and a cyano group, but embodiments are not limited thereto.

In an exemplary embodiment, $Q_{11}$, $Q_{12}$, $Q_{13}$, $Q_{14}$, $Q_{15}$, $Q_{16}$, $Q_{17}$, $Q_{18}$, $Q_{19}$, $Q_{20}$, $Q_{21}$, and $Q_{22}$ of Chemical Formulas 1-1, 1-2, 1-3, 1-4, and 1-5, $Q_{11}$ to $Q_{22}$ are each independently selected from hydrogen, —F, —Cl, and a cyano group, but embodiments are not limited thereto.

In an exemplary embodiment, the second material of the second capping layer 132 is represented by one of Chemical Formulas 1-11, 1-12, 1-13, 1-14, and 1-15, but embodiments are not limited thereto:

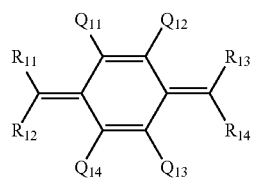
1-11

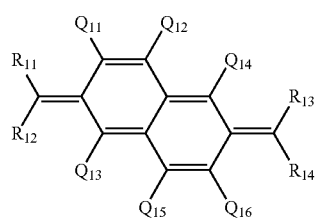
1-12

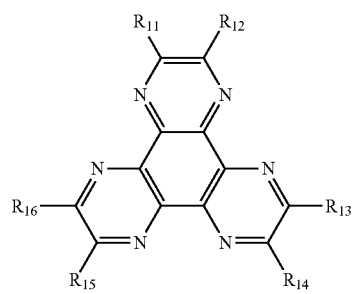
1-13

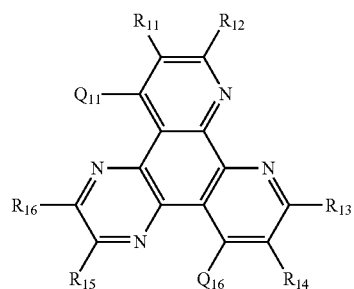
1-14

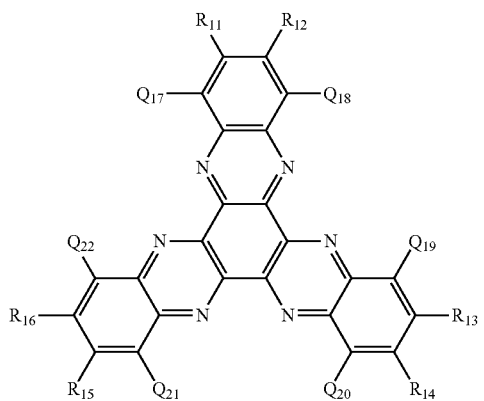
1-15 wherein, in Chemical Formulas 1-11, 1-12, 1-13, 1-14, and 1-15, $R_{11}$, $R_{12}$, $R_{13}$, $R_{14}$, $R_{15}$, and $R_{16}$ and $Q_{11}$, $Q_{12}$, $Q_{13}$, $Q_{14}$, $Q_{15}$, $Q_{16}$, $Q_{17}$, $Q_{18}$, $Q_{19}$, $Q_{20}$, $Q_{21}$, and $Q_{22}$ may be each independently selected from a hydrogen, a deuterium, —F, —Cl, —Br, —I, a cyano group, and a nitro group.

In an exemplary embodiment, $R_{11}$, $R_{12}$, $R_{13}$, $R_{14}$, $R_{15}$, and $R_{16}$ and $Q_{11}$, $Q_{12}$, $Q_{13}$, $Q_{14}$, $Q_{15}$, $Q_{16}$, $Q_{17}$, $Q_{18}$, $Q_{19}$, $Q_{20}$, $Q_{21}$, and $Q_{22}$ of Chemical Formulas 1-11, 1-12, 1-13, 1-14, and 1-15 are each independently selected from a hydrogen, —F, —Cl, and a cyano group, but embodiments are not limited thereto.

In an exemplary embodiment, the second material of the second capping layer 132 may be selected from Chemical Compounds 1, 2, 3, 4, 5, 6, 7, 8, and 9, but embodiments are not limited thereto:

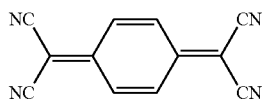
1

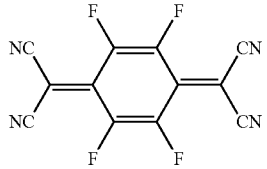
2

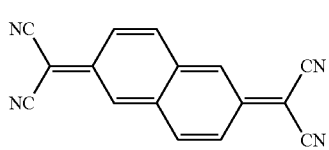
3

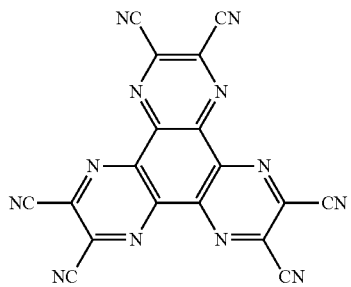
4

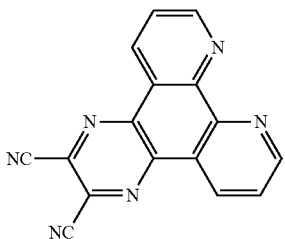

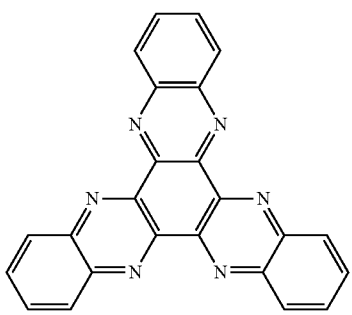

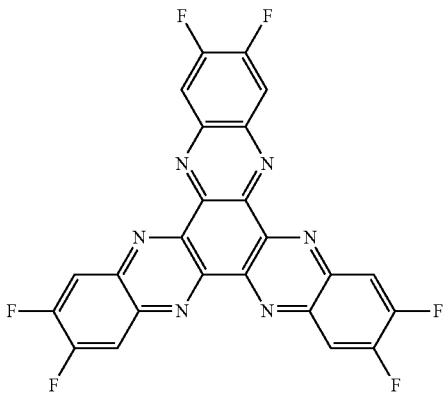

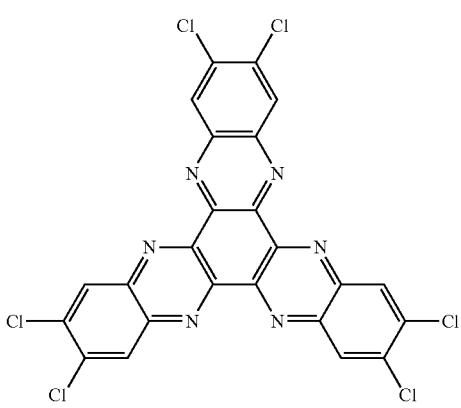

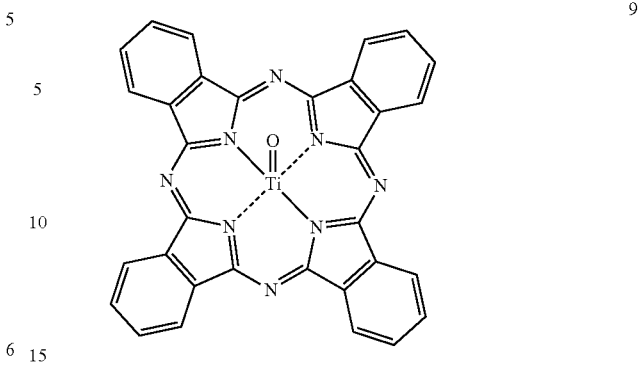

A weight ratio of the first material to the second material of the second capping layer 132 may be in a range of about 50:50 to about 99:1. In an exemplary embodiment, a weight ratio of the first material to the second material is in a range of about 70:30 to about 90:10.

The first capping layer 131 and the second capping layer 132 may be sequentially disposed on the organic light-emitting diode (OLED) device 120.

The refractive index of the first capping layer 131 and that of the second capping layer 132 may be different from each other. More specifically, the refractive index of the first capping layer 131 may be less than that of the second capping layer 132.

Due to the difference between the refractive index of the first capping layer 131 and that of the second capping layer 132 of the capping layer 130, part of light emitted from the emission layer may pass through the capping layer 130 and the remaining light emitted from the emission layer may be reflected by the capping layer 130. More specifically, light emitted from the emission layer may be reflected at an interface between the first capping layer 131 and the second capping layer 132 or at an interface between the second capping layer 132 and an air layer 140.

Light reflected by the capping layer 130 may be amplified when reflected by the first electrode 111 or the second electrode 112. In an exemplary embodiment, light may be amplified by being repeatedly reflected inside the capping layer 130. Due to the resonance effect, the OLED display apparatus 100 may effectively amplify light, thereby having increased light efficiency.

In an exemplary embodiment, the refractive index of the first capping layer 131 is less than the refractive index of the second capping layer 132. For example, the refractive index of the first capping layer 131 may be in a range of about 1.3 to about 2.0, and the refractive index of the second capping layer 132 may be in a range of about 1.7 to about 2.7.

The thickness of the second capping layer 132 may be greater than that of the first capping layer 131.

The thickness of the first capping layer 131 may be in a range of about 1 nm to about 50 nm, or about 5 nm to about 25 nm, but embodiments are not limited thereto.

The thickness of the second capping layer 132 may be in a range of about 30 nm to about 100 nm, or about 60 nm to about 90 nm, but embodiments are not limited thereto.

The first capping layer 131 may include a third material. The third material may be selected from lithium fluoride (LiF), 8-hydroxyquinolinolatolithium (Liq), 8-hydroxyquinolinolatosodium (Naq), BAlq$_3$, and tris(8-hydroxyquinolinato)aluminium (Alq$_3$), but embodiments are not limited thereto.

Hereinafter a method of manufacturing the OLED display apparatus 100 will be described.

The OLED device 120 may be formed on the substrate 110. The OLED device 120 may be formed by using any known method to one of ordinary skill in the art.

The capping layer 130 including the first capping layer 131 and the second capping layer 132 may be formed on the OLED device 120 to cover the OLED device 120. The first capping layer 131, the second capping layer 132, and the capping layer 130 may be understood by referring to the descriptions above.

The first capping layer 131 may be formed by vapor-depositing the third material on the OLED device 120.

The second capping layer 132 may be formed by co-depositing the first material and second material on the first capping layer 131.

As described above, the capping layer 130 may be formed by sequentially vapor-depositing the first capping layer 131 and the second capping layer 132.

The OLED display apparatus has been described in detail. However, the OLED display apparatus is not limited to the descriptions above.

Hereinafter an organic light-emitting diode (OLED) display apparatus according to an exemplary embodiment will be described in detail with reference to Synthesis Examples and Comparative Examples; however, the inventive concept it not limited thereto.

Example R1

On an ITO substrate, an OLED device including 4,4',4"-Tris(N-3-methylphenyl-N-phenylamino)triphenylamine (MTDATA) (125 nm)/N,N'-Bis(naphthalen-1-yl)-N,N'-bis(phenyl)-benzidine (NPB) (80 nm)/4,4'-di(N-carbazol-9-yl)-biphenyl:(bis(2-(2'-benzothienyl)-pyridinato-N,C3')iridium (acetylacetonate)) (CBP:Ir (btp)$_2$acac) (40 nm, at a weight ratio of about 96:4)/bathocuproine (BCP) (5 nm)/Alq$_3$ (35 nm)/8-hydroxyquinolatolithium (LiQ) (1 nm)/MgAg (14 nm) was formed. On the organic light-emitting device, Bis(2-methyl-8-quinolinolate)-4-(phenylphenolato)aluminium (Balq) was vapor-deposited to form a first capping layer having a thickness of about 20 nm. On the first capping layer, HT1 and Chemical Compound 4 were co-deposited at a weight ratio of about 10:1 to form a second capping layer having a thickness of about 64 nm, thereby manufacturing an OLED display apparatus.

Example G1

On an ITO substrate, an OLED device including MTDATA (125 nm)/NPB (35 nm)/4,4'-di(N-carbazol-9-yl)-biphenyl:fac tris(2-phenyl-pyridinato-N,C$^2$) Iridium ((CBP):Ir(ppy)$_3$) (40 nm, at a weight ratio of about 85:15)/BCP (5 nm)/tris-(8-hydroxyquinoline)aluminum) (Alq$_3$) (35 nm)/LiQ (1 nm)/MgAg (14 nm) was formed. On the organic light-emitting device, Balq was vapor-deposited to form a first capping layer having a thickness of about 20 nm. On the first capping layer, HT1 and Chemical Compound 4 were co-deposited at a weight ratio of about 10:1 to form a second capping layer having a thickness of about 64 nm, thereby manufacturing an OLED display apparatus.

Example B1

On an ITO substrate, an OLED device including MTDATA (125 nm)/2-tert-Butyl-9,10-di(naphth-2-yl)anthracene: 4,4'-Bis[4-(di-p-tolylamino)styryl]biphenyl (TBADN:DPAVBi) (20 nm, at a weight ratio of about 97:3)/Alq$_3$ (35 nm)/LiQ (1 nm)/MgAg (14 nm) was formed. On the organic light-emitting device, Balq was vapor-deposited to form a first capping layer having a thickness of about 20 nm. On the first capping layer, HT1 and Chemical Compound 4 were co-deposited at a weight ratio of about 10:1 to form a second capping layer having a thickness of about 64 nm, thereby manufacturing an OLED display apparatus.

Example R2

An OLED display apparatus was manufactured in the same manner as in Example R1, except that HT1 and Chemical Compound 4 were co-deposited at a weight ratio of about 20:1 to form a second capping layer having a thickness of about 64 nm.

Example G2

An OLED display apparatus was manufactured in the same manner as in Example G1, except that HT1 and Chemical Compound 4 were co-deposited at a weight ratio of about 20:1 to form a second capping layer having a thickness of about 64 nm.

Example B2

An OLED display apparatus was manufactured in the same manner as in Example B1, except that HT1 and Chemical Compound 4 were co-deposited at a weight ratio of about 20:1 to form a second capping layer having a thickness of about 64 nm.

Comparative Example R1

An OLED apparatus was manufactured in the same manner as in Example R1, except that HT1 was vapor-deposited instead of HT1 and Chemical Compound 4 to form a second capping layer having a thickness of about 64 nm.

Comparative Example G1

An OLED display apparatus was manufactured in the same manner as in Example G1, except that HT1 was vapor-deposited instead of HT1 and Chemical Compound 4 to form a second capping layer having a thickness of about 64 nm.

Comparative Example B1

An OLED display apparatus was manufactured in the same manner as in Example B1, except that HT1 was vapor-deposited instead of HT1 and Chemical Compound 4 to form a second capping layer having a thickness of about 64 nm.

Comparative Example B2

An OLED display apparatus was manufactured in the same manner as in Example B1, except that Chemical Compound 4 was vapor-deposited instead of HT1 and Chemical Compound 4 to form a second capping layer having a thickness of about 64 nm.

Evaluation Example 1: Color-Shift Evaluation on an OLED Display Apparatus

Applied voltage/current (IVL) according to an angle of the organic light-emitting display apparatuses prepared in Examples R1, G1, B1, R2, G2, B2, Comparative Examples R1, G1, B1, R2, G2, and B2 were measured by using a Keithley SMU 2635A and SR-3A spectro-photometer. The results are shown in Table 1.

Here, color-shift value d(u'v') may be calculated, following the method below:
1) x and y (CIE 1931) values according to an angle were measured.
2) Following Equations 1 and 2, u' and v' were calculated.

$$u'=4x/(3+12xy-2x) \quad \text{(Equation 1)}$$

$$v'=9y/(3+12y-2x) \quad \text{(Equation 2)}$$

3) by using u' and v' which were calculated in 2), and Equation 3, below, the color-shift value d(u'v') was calculated.

$$d(u'v')=((u'(0\ \text{degree})-u'(\text{specific angle}))^2+(v'(0\ \text{degree})-v'(\text{specific angle}))^2)^{0.5} \quad \text{(Equation 3)}$$

TABLE 1

|  | θ = 0° | | | θ = 30° | | | θ = 60° | | |
| --- | --- | --- | --- | --- | --- | --- | --- | --- | --- |
|  | x | y | d(u'v') | x | y | d(u'v') | x | y | d(u'v') |
| Example R1 | 0.67 | 0.329 | 0 | 0.654 | 0.346 | 0.031 | 0.626 | 0.373 | 0.076 |
| Example G1 | 0.254 | 0.705 | 0 | 0.21 | 0.722 | 0.018 | 0.168 | 0.685 | 0.034 |
| Example B1 | 0.143 | 0.044 | 0 | 0.147 | 0.038 | 0.017 | 0.149 | 0.037 | 0.021 |
| Example R2 | 0.67 | 0.329 | 0 | 0.653 | 0.346 | 0.031 | 0.624 | 0.373 | 0.078 |
| Example G2 | 0.254 | 0.705 | 0 | 0.205 | 0.722 | 0.020 | 0.167 | 0.685 | 0.034 |
| Example B2 | 0.142 | 0.045 | 0 | 0.146 | 0.038 | 0.019 | 0.149 | 0.037 | 0.024 |
| Comparative Example R1 | 0.673 | 0.326 | 0 | 0.654 | 0.342 | 0.033 | 0.626 | 0.371 | 0.081 |
| Comparative Example G1 | 0.262 | 0.703 | 0 | 0.21 | 0.725 | 0.022 | 0.163 | 0.685 | 0.039 |
| Comparative Example B1 | 0.141 | 0.046 | 0 | 0.146 | 0.038 | 0.022 | 0.149 | 0.037 | 0.027 |
| Comparative Example B2 | 0.141 | 0.046 | 0 | 0.148 | 0.038 | 0.024 | 0.154 | 0.032 | 0.043 |

Figure 2:
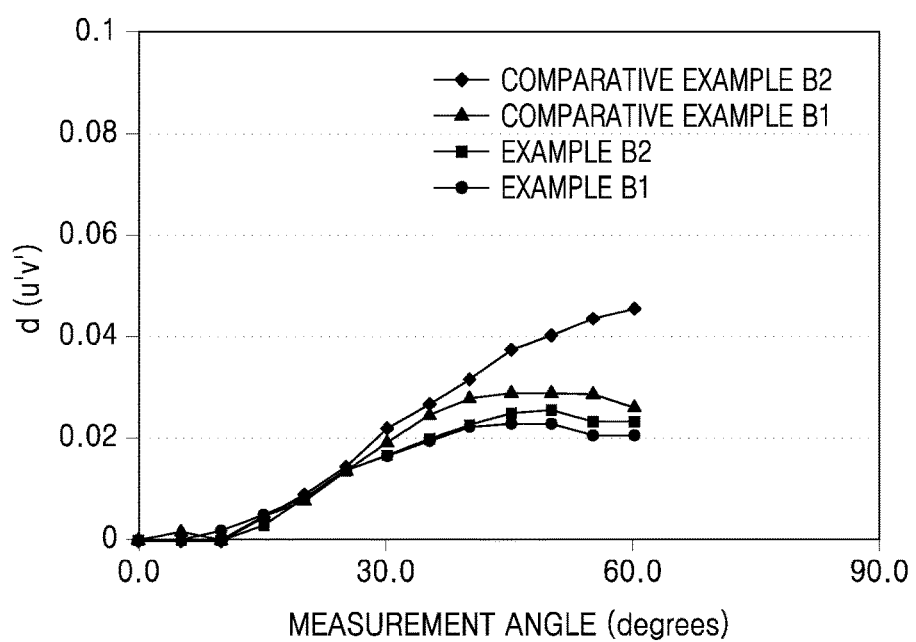
FIG. 2 is a graph of color-shift value d(u'v') versus a measurement angle in degrees of an organic light-emitting display apparatus according to an exemplary embodiment and comparative examples.

As apparent from Table 1 and FIG. 2, the OLED display apparatuses prepared in Examples R1, G1, and B1 each had a d(u'v') value less than a d(u'v') value of the OLED display apparatuses prepared in Comparative Examples R1, G1, B1, and B2, respectively. Therefore, it was found that the OLED display apparatuses prepared in Examples R1, G1, and B1 had less color-shift compared to the OLED display apparatuses prepared in Comparative Examples R1, G1, B1, and B2.

As described above, an OLED apparatus according to an exemplary embodiment has a high efficiency and less color-shift caused by a viewing angle.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting diode (OLED) display apparatus, comprising:
   a substrate;
   an OLED device on the substrate; and
   a capping layer on the OLED device,
   wherein the capping layer comprises a first capping layer and a second capping layer, the second capping layer consists of a first material and a second material, and the first material and the second material are different from each other,
   wherein the first material is selected from the group consisting of an organic low molecular weight compound and an organic polymer compound,
   wherein the second material is an organic low molecular weight compound
   wherein a weight ratio of the first material to the second material is in a range of about 50:50 to about 99:1, and
   wherein a thickness of the second capping layer is in a range of about 30 nm to about 100 nm.

2. The OLED display apparatus of claim 1, wherein the first material has a refractive index in a range of about 1.7 to about 2.7.

3. The OLED display apparatus of claim 1, wherein the first material is represented by Chemical Formula 201:

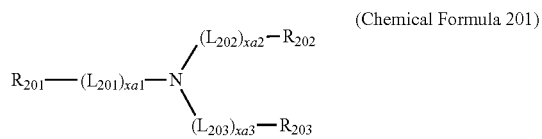

(Chemical Formula 201)

wherein, $L_{201}$, $L_{202}$, and $L_{203}$ are each independently selected from a substituted or unsubstituted $C_3$-$C_{10}$ cycloalkylene, a substituted or unsubstituted $C_1$-$C_{10}$ heterocycloalkylene, a substituted or unsubstituted $C_3$-$C_{10}$ cycloalkenylene, a substituted or unsubstituted $C_1$-$C_{10}$ hetetocycloalkenylene, a substituted or unsub stituted $C_6$-$C_{60}$ arylene, a substituted or unsubstituted $C_1$-$C_{60}$ heteroarylene, a substituted or unsubstituted divalent non-aromatic condensed polycyclic group, and a substituted or unsubstituted divalent non-aromatic condensed heteropolycyclic group;

xa1, xa2, and xa3 are each independently selected from 0, 1, 2, and 3;

$R_{201}$, $R_{202}$, and $R_{203}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_1$-$C_{60}$ heteroaryl group, substituted monovalent non-aromatic condensed polycyclic group, and substituted monovalent non-aromatic condensed heteropolycyclic group is selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

4. The OLED display apparatus of claim 1, wherein the first material is selected from Chemical Compounds HT1, HT2, HT3, HT4, HT5, HT6, HT7, HT8, HT9, HT10, HT11, and HT12:

HT1

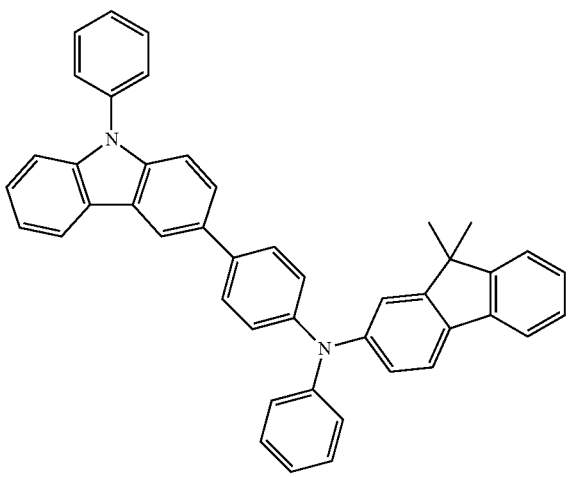

HT2

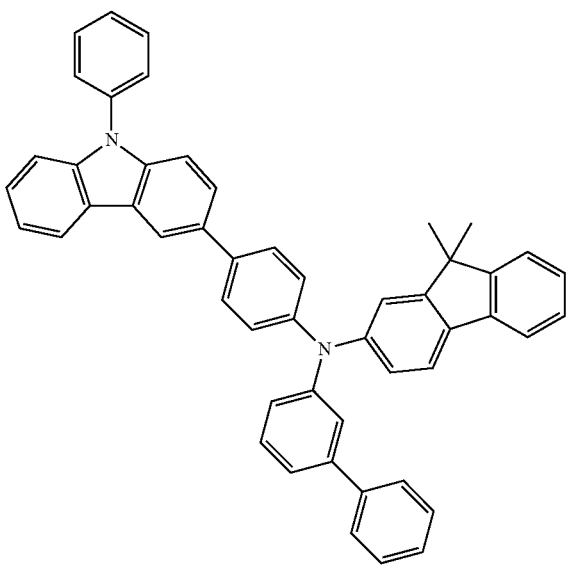

HT3
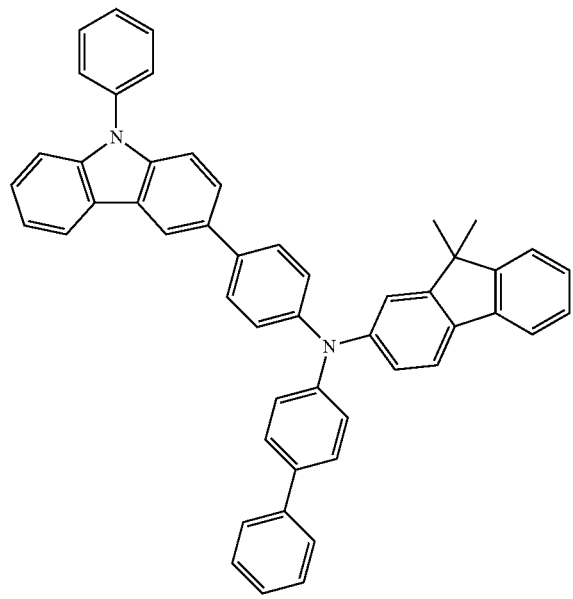
HT5
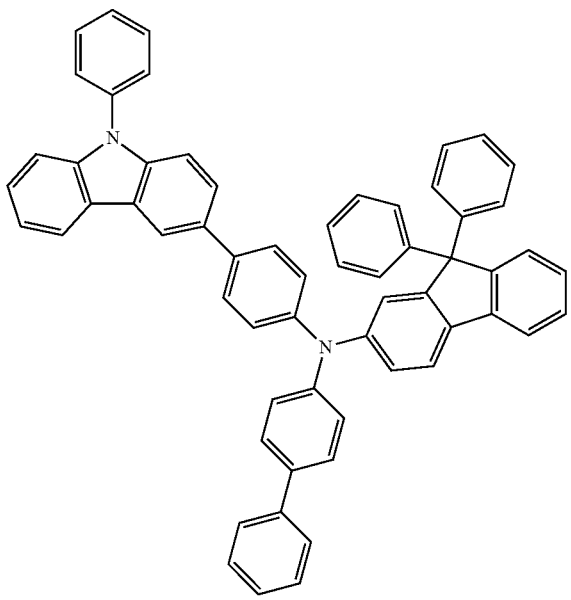
HT4
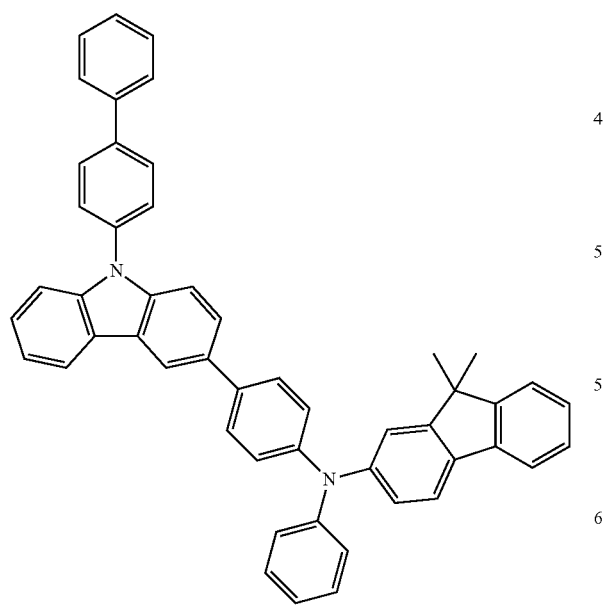
HT6
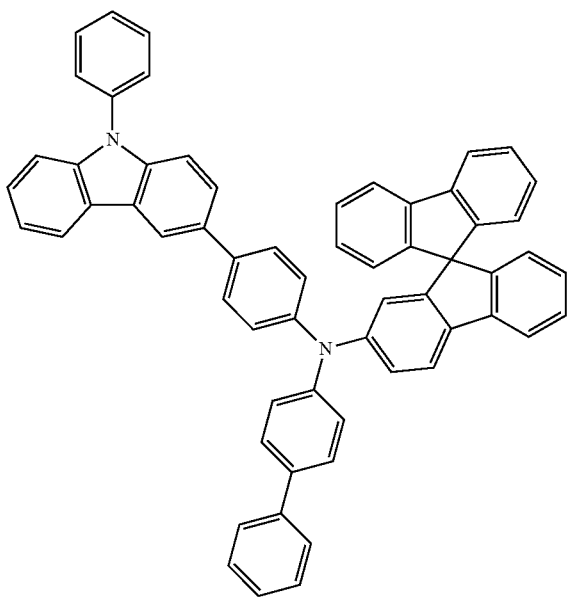

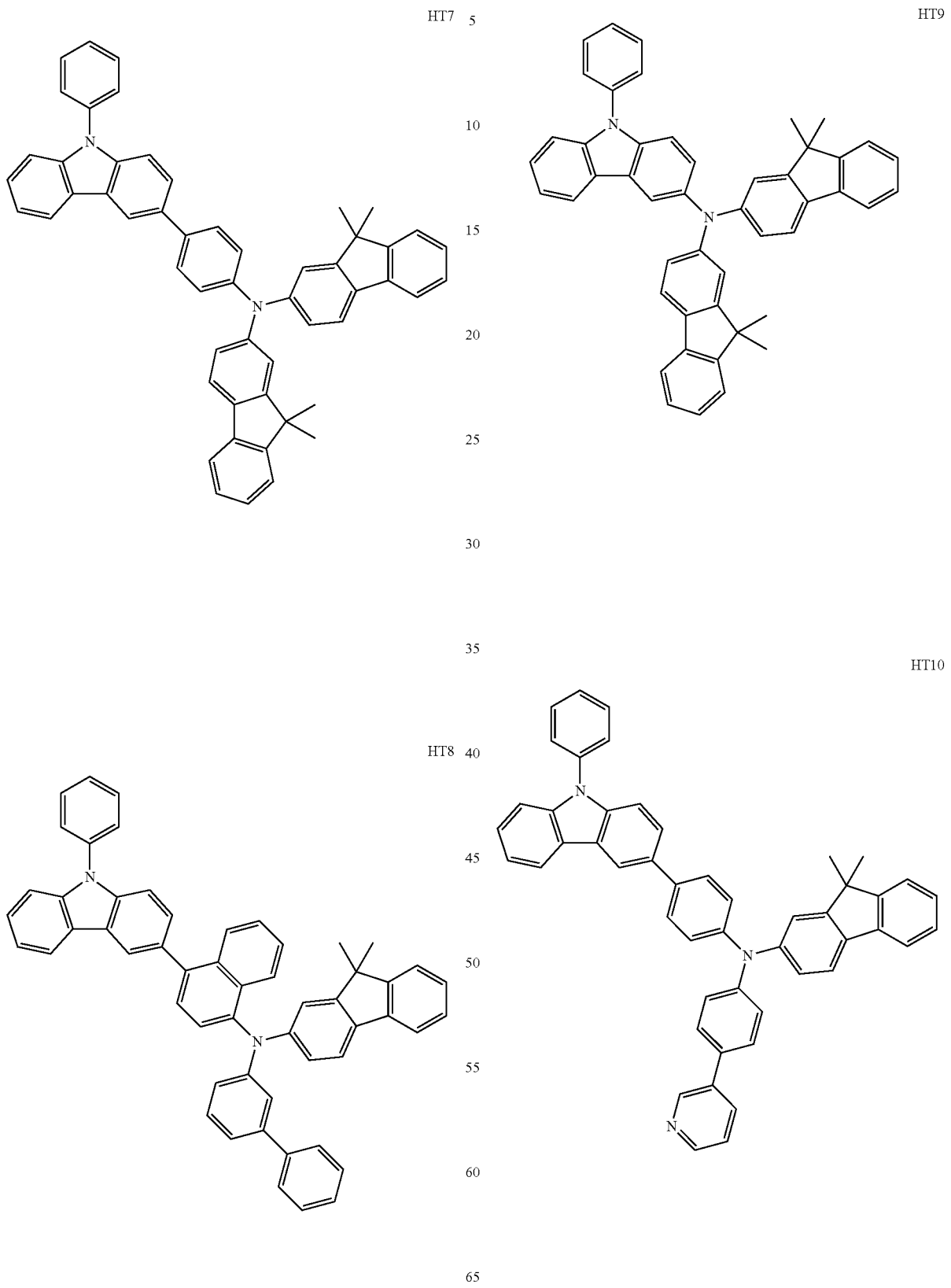

-continued

HT11

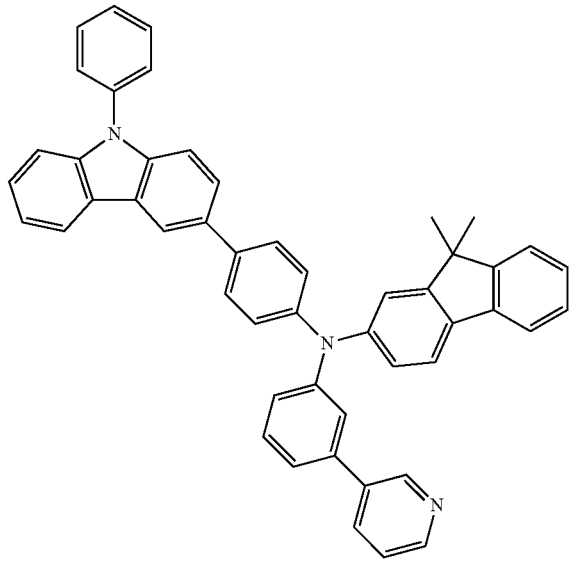

HT12

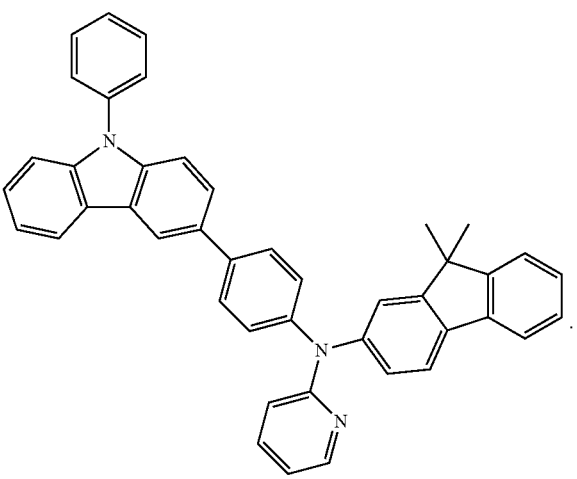

5. The OLED display apparatus of claim 1, wherein the first material is selected from an acrylic resin, a polyimide, and a polyamide.

6. The OLED display apparatus of claim 1, wherein the second material is represented by one of Chemical Formulas 1-1, 1-2, 1-3, 1-4, and 1-5:

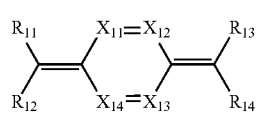  1-1

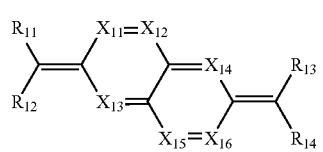  1-2

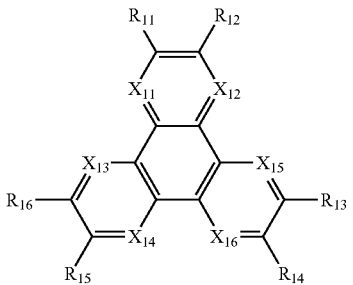  1-3

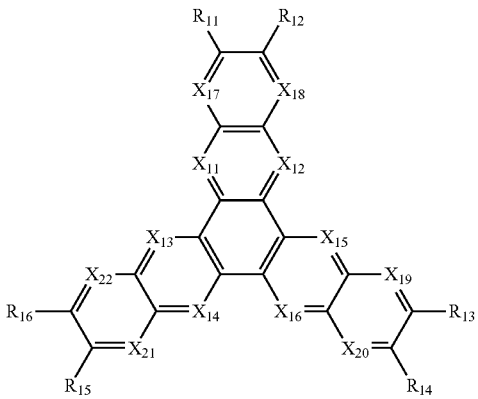  1-4

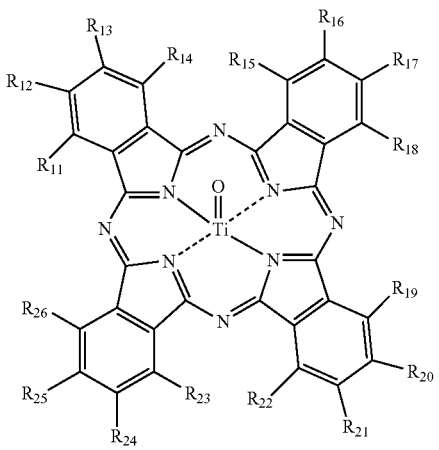  1-5 wherein $R_{11}$ $R_{12}$, $R_{13}$, $R_{14}$, $R_{15}$, $R_{16}$, $R_{17}$, $R_{18}$, $R_{19}$, $R_{20}$, $R_{21}$, $R_{22}$, $R_{23}$, $R_{24}$, $R_{25}$, and $R_{26}$ are each independently selected from hydrogen, deuterium, —F, —Cl, —Br, —I, a cyano group, and a nitro group;

wherein $X_{11}$ is N or $C(Q_{11})$; $X_{12}$ is N or $C(Q_{12})$; $X_{13}$ is N or $C(Q_{13})$; $X_{14}$ is N or $C(Q_{14})$; $X_{15}$ is N or $C(Q_{15})$; $X_{16}$ is N or $C(Q_{16})$; $X_{17}$ is N or $C(Q_{17})$; $X_{18}$ is N or $C(Q_{18})$; $X_{19}$ is N or $C(Q_{19})$, $X_{20}$ is N or $C(Q_{20})$; $X_{21}$ is N or $C(Q_{21})$; and $X_{22}$ is N or $C(Q_{22})$; and wherein $Q_{11}$ $Q_{12}$, $Q_{13}$, $Q_{14}$, $Q_{15}$, $Q_{16}$, $Q_{17}$, $Q_{18}$, $Q_{19}$, $Q_{20}$, $Q_{21}$, and $Q_{22}$ are each independently selected from hydrogen, deuterium, —F, —Cl, —Br, —I, a cyano group, and a nitro group.

7. The OLED display apparatus of claim 1, wherein the second material is represented by one of Chemical Formulas 1-11, 1-12, 1-13, 1-14, and 1-15:

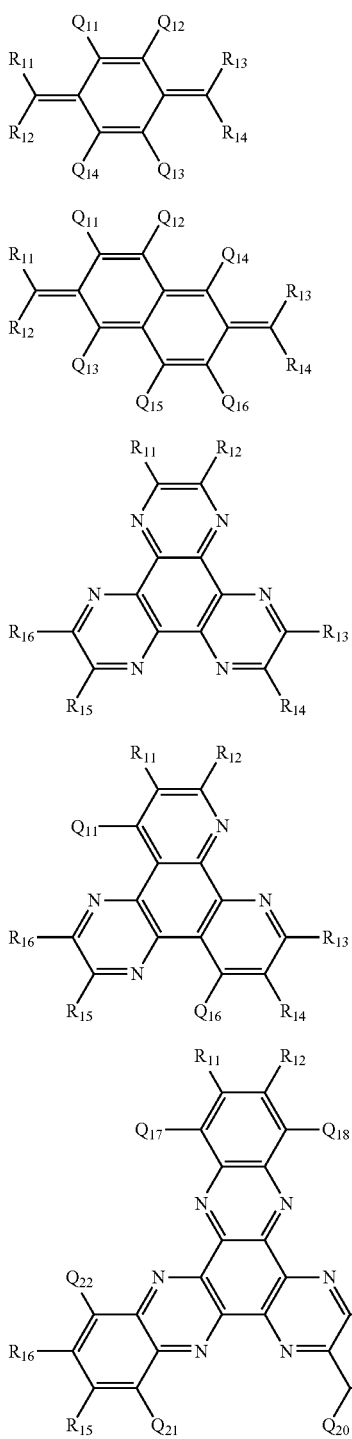
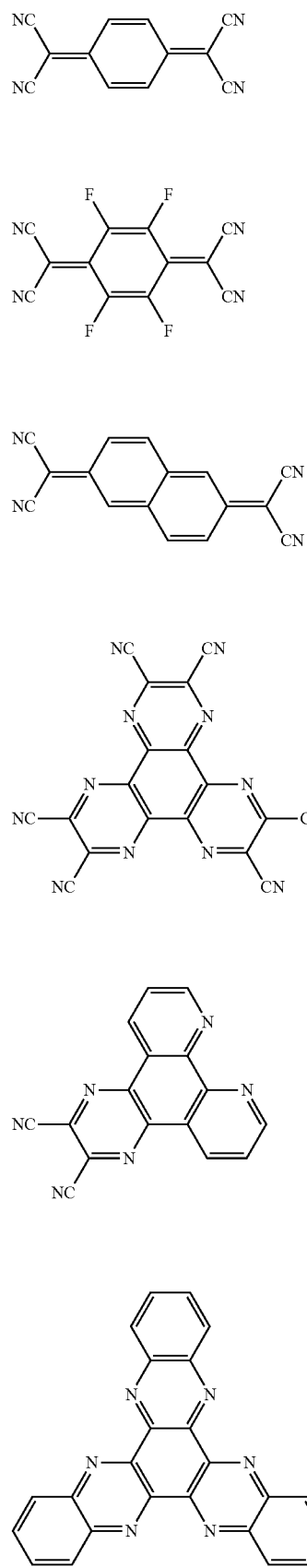
wherein, in Chemical Formulas 1-11 to 1-15, $R_{11}$, $R_{12}$, $R_{13}$, $R_{14}$, $R_{15}$, $R_{16}$, $R_{17}$, $R_{18}$, $R_{19}$, $R_{20}$, $R_{21}$, $R_{22}$, $R_{23}$, $R_{24}$, $R_{25}$, and $R_{26}$ and $Q_{11}$, $Q_{12}$, $Q_{13}$, $Q_{14}$, $Q_{15}$, $Q_{16}$, $Q_{17}$, $Q_{18}$, $Q_{19}$, $Q_{20}$, $Q_{21}$, and $Q_{22}$ are each independently selected from hydrogen, deuterium, —F, —Cl, —Br, —I, a cyano group, and a nitro group.
8. The OLED display apparatus of claim 1, wherein the second material is selected from Chemical Compounds 1, 2, 3, 4, 5, 6, 7, 8, and 9:

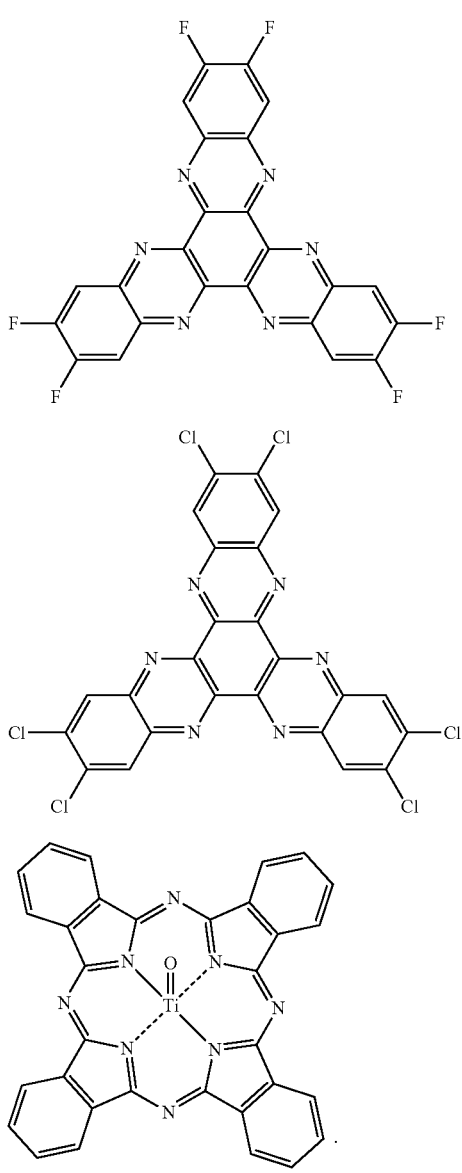

9. The OLED display apparatus of claim 1, wherein the first capping layer and the second capping layer are sequentially disposed on the organic light-emitting device.

10. The OLED display apparatus of claim 1, wherein a refractive index of the first capping layer and a refractive index of the second capping layer are different from each other.

11. The OLED display apparatus of claim 1, wherein a refractive index of the first capping layer is less than a refractive index of the second capping layer.

12. The OLED display apparatus of claim 1, wherein the first material has a refractive index in a range of about 1.3 to about 2.0.

13. The OLED display apparatus of claim 1, wherein the first material has a refractive index in a range of about 1.7 to about 2.7.

14. The OLED display apparatus of claim 1, wherein a thickness of the second capping layer is greater than a thickness of the first capping layer.

15. The OLED display apparatus of claim 1, wherein a thickness of the first capping layer is in a range of about 1 nm to about 50 nm.

16. The OLED display apparatus of claim 1, wherein the first capping layer comprises a material selected from LiF, LiQ, BAlq, and Alq$_3$.

17. The OLED display apparatus of claim 1, wherein a thickness of the second capping layer is in a range of about 60 nm to about 90 nm.

18. A method of manufacturing an organic light-emitting diode (OLED) display apparatus, comprising:
    forming an OLED device on a substrate; and
    forming a capping layer on the OLED device, the capping layer comprising a first capping layer and a second capping layer,
    wherein the second capping layer consists of a first material and a second material that are different from each other,
    wherein the first material is selected from the group consisting of an organic low molecular weight compound and an organic polymer compound,
    wherein the second material is an organic low molecular weight compound
    wherein a weight ratio of the first material to the second material is in a range of about 50:50 to about 99:1, and
    wherein a thickness of the second capping layer is in a range of about 30 nm to about 100 nm.

19. The method of claim 18, wherein the second capping layer is formed by co-depositing the first material and the second material.

* * * * *